US006566980B2

United States Patent
Abbott

(10) Patent No.: US 6,566,980 B2
(45) Date of Patent: May 20, 2003

(54) DIE LAYOUT FOR SAW DEVICES AND ASSOCIATED METHODS

(75) Inventor: Benjamin P. Abbott, Orlando, FL (US)

(73) Assignee: Sawtek, Inc., Orlando, FL (US)

( * ) Notice: Subject to any disclaimer, the term of this patent is extended or adjusted under 35 U.S.C. 154(b) by 0 days.

(21) Appl. No.: 09/823,270

(22) Filed: Mar. 30, 2001

(65) Prior Publication Data
US 2002/0030564 A1 Mar. 14, 2002

Related U.S. Application Data

(60) Provisional application No. 60/193,192, filed on Mar. 30, 2000.

(51) Int. Cl.[7] .............................. H03H 9/64; H03H 3/08
(52) U.S. Cl. ................... 333/193; 333/195; 310/313 B; 310/313 D; 29/25.35
(58) Field of Search ................................. 333/150–155, 333/193–196; 310/313 R, 313 B, 313 A, 313 C, 313 D; 29/25.35

(56) References Cited

U.S. PATENT DOCUMENTS

| | | | | |
|---|---|---|---|---|
| 3,772,618 A | * | 11/1973 | Slobodnik, Jr. | ............. 333/155 |
| 3,800,247 A | * | 3/1974 | Tancrell et al. | ............. 333/151 |
| 3,974,463 A | * | 8/1976 | Onodera et al. | ............. 333/151 |
| 4,328,472 A | * | 5/1982 | Grudkowski | ................. 333/141 |
| 4,577,169 A | * | 3/1986 | Meeker et al. | ............... 333/194 |
| 5,818,145 A | * | 10/1998 | Fukiharu | ................ 310/313 R |
| 5,912,602 A | * | 6/1999 | Takagi et al. | ................ 333/193 |
| 6,321,444 B1 | * | 11/2001 | Yatsuda et al. | ................ 29/832 |
| 6,369,673 B1 | * | 4/2002 | Kondo et al. | ................ 333/193 |

FOREIGN PATENT DOCUMENTS

| JP | 9-116378 | * | 5/1997 |
|---|---|---|---|
| JP | 10084249 | | 3/1998 |

* cited by examiner

*Primary Examiner*—Barbara Summons
(74) *Attorney, Agent, or Firm*—Allen, Dyer, Doppelt, Milbrath & Gilchrist, P.A.

(57) ABSTRACT

A surface-acoustic-wave die includes a generally rectangular die that comprises a piezoelectric material, atop which is positioned a surface-acoustic-wave electrode pattern. The pattern has a generally rectangular footprint, and the footprint has a top edge that is positioned at an acute, nonzero angle to a top end of the die. A pair of generally rectangular electrode pads are both in electrical contact with the electrode pattern, each pad adjacent diametrically opposed corners of the die. The device addresses the inefficiency in the conventional die layout technique, and provides a method for reducing the width of the die for SAW coupled resonator filters resulting in a smaller package.

16 Claims, 3 Drawing Sheets

DIE LAYOUT FOR SAW DEVICES AND ASSOCIATED METHODS

CROSS-REFERENCE TO RELATED APPLICATION

This application claims priority to provisional application Ser. No. 60/193,192, "Modified Die Layout for SAW Devices," filed Mar. 30, 2000.

BACKGROUND OF THE INVENTION

1. Field of the Invention

The present invention relates to die layouts for electronic circuits, and, more specifically, to die layouts for surface-acoustic-wave devices.

2. Description of Related Art

SAW devices typically comprise interdigitated conductive electrode patterns (transducers) and conductive electrode grating patterns on a surface of piezoelectric materials. When an alternating-polarity electrical signal is applied to the transducer of these devices, a surface acoustic wave is launched at the surface of the piezoelectric material. The electrode grating regions of the device serve to reflect the surface wave due to mechanical and electrical effects. The interdigitated conductive electrode patterns of the transducer have electrode regions and bus-bar regions. The transducer electrode regions serve to stress the piezoelectric and generate an acoustic wave when signals of alternating polarity are applied, while the bus-bar regions serve to electrically connect the individual electrodes in the electrode region to one polarity or the other, and to transmit the applied voltage to the electrodes. The conductive bus-bar regions that are connected to device electrical terminals to which voltage is applied are usually called bond pads, while the conductive bus-bar regions that are electrically connected to ground are generally called ground pads.

The gratings also have electrode regions and bus-bar regions. The electrode regions serve to reflect the surface acoustic wave, while the bus-bar regions serve to electrically connect the individual electrodes in the electrode region to one polarity.

SAW device types known as coupled resonator filters (CRFs) utilize multiple resonant regions coupled acoustically and electrically in configurations designed to achieve a desired frequency response. A typical CRF structure comprises two parallel tracks, each consisting of a central transducer with two bus bars and bond pads, two additional interdigitated transducer regions on either side of the central transducer, and two reflective gratings at the outer ends of this transducer structure. The "hot" bond pads for the transducers are isolated. The outer transducers do not have bond pads, but rather one bus bar polarity is connected with the ground pads of the adjacent gratings, and the other polarity bus bar is connected electrically to the bus bar of the similar transducer in the second track. Thus these transducers are electrically connected, and the nongrounded sides of these transducers are "floating" relative to the electric potential of the central transducers. Within each track, a resonance is established when the central transducer launches an acoustic wave. The series-connected floating transducers serve to couple the signal between the two tracks. A typical CRF layout 10 with isolated central transducers 11, 12 is shown by way of example in FIG. 1. It should be noted that all the figures presented herein have been simplified and enlarged to show the details of the device layout. Typical devices would have many more electrodes than illustrated.

Traditionally, for CRF devices the electrode regions have been oriented perpendicular to the direction of surface-wave propagation and parallel to the "ends" 13, 14 of the SAW device die 10. In this traditional configuration, the bus bars are generally parallel to the other set of die edges (the "sides" 15, 16 of the die). This type of layout 10 is shown in FIG. 1. Electrical performance requirements make it essential for the isolated "hot" bond pads 17, 18 to be placed in close proximity to, and in good electrical contact with, the central transducer bus bar 19, 20. Manufacturing requirements dictate minimum sizes for bond pads, and that certain blank regions of crystal be left between the edge of the die and any metallized region, be it electrode or bus bar. This is particularly important for devices that are mounted using flip-chip technology, where the bumps formed on the bond pads can be torn off at the time the dies are singulated if the bond pads are not set far enough back from the die edge.

It can be seen from FIG. 1 that the bus-bar and bond pad sizes and bare die regions add to the overall size of the die 10. The choice of package size is dependent on how small the die can be made for a given level of electrical performance. Customers typically have requirements for electrical performance and desire as small a package size as possible. Thus improvements in die layout that result in a reduction in die size for a given electrical performance allow for an overall reduction in package and device size. In this case, reduction in the length of the die will result in package size reduction.

Historically, the die edges nominally perpendicular to the direction of surface-wave propagation have been called the "ends" 13, 14 of the die 10, and the spatial extent of the die perpendicular to these ends 13, 14 has been called the die width 21. The die edges parallel to the direction of surface-wave propagation have been called the "sides" 15, 16 of the die. We will retain this terminology of die ends, sides, length, and width, even though the CRF devices under consideration often have aspect ratios such that the width may exceed the length. Generally CRF devices are small enough in the length dimension to fit into the small packages desired by the customer, but the problem arises in the width of the die required. In order to fit multiple transducer apertures and multiple (often 3 or more) bus bars and bond pads across the width of a die, the die width must be made substantially larger than necessary for the active electrode region alone. Specifically, the need to maintain the isolated hot bond pads 17, 18 for the two central transducers 11, 12 in close proximity to, and in good electrical contact with, the central transducers' bus bars 19, 20 dictates that the largest dimension on the die electrode layout be the length 22 from the outer edge of one central transducer's 11 hot bond pad 17 to the outer edge of the other central transducer's 12 hot bond pad 18. This dimension can be reduced as much as possible within manufacturing tolerances, but even when reduced as much as possible (while maintaining electrical performance and impedance characteristics), this dimension is the limiting factor in reducing die size further.

Further features of the prior art die 10 include four gratings 23, two surrounding each central transducer 11,12, and four bond pads 24 leading thereto. Generally square bond pads 17,18,24 are in this design generally collinear and are adjacent the sides 15,16 of the die 10, with their outer edges generally parallel the sides 15,16, and their top and bottom edges generally parallel the ends 13,14. In such an embodiment the width 21 is smaller than the length 22 of the die 10.

Whereas in FIG. 1, the two bond pads 25, 26 between the transducer/grating array are separate and in spaced relation to each other, FIG. 2 illustrates another prior art embodiment 10' in which the two bond pads 25', 26' have been joined, reducing the die width 21' and length 22' slightly.

SUMMARY OF THE INVENTION

It is therefore an object of the present invention to provide a die layout that reduces die width.

It is another object to provide such a die layout that increases efficiency.

It is a further object to provide such a die layout that reduces package size.

It is an additional object to provide such a die layout that results in a reduced device size.

These and other objects are achieved by the present invention, a surface-acoustic-wave device. The device comprises a generally rectangular die that comprises a piezoelectric material. A surface-acoustic-wave electrode pattern is positioned atop the die. The pattern has a generally rectangular footprint, and the footprint has a top edge that is positioned at an acute, nonzero angle to a top end of the die. The die further comprises a pair of generally rectangular electrode pads. Both of the electrode pads are in electrical contact with the electrode assembly, such that a first pad is adjacent a first corner formed by a bottom end and a first side of the base, and a second pad is adjacent a second corner formed by the top end and a second side of the base, which is opposed to the first side.

The present invention addresses the inefficiency in the conventional die layout technique, and provides a general method for reducing the width of the die (reducing the spatial extent of the longest die edge) for SAW CRF filters. This reduction in die width yields a possibility of a smaller package, resulting in an overall smaller device, which can be more efficient and more competitive in the marketplace.

The features that characterize the invention, both as to organization and method of operation, together with further objects and advantages thereof, will be better understood from the following description used in conjunction with the accompanying drawing. It is to be expressly understood that the drawing is for the purpose of illustration and description and is not intended as a definition of the limits of the invention. These and other objects attained, and advantages offered, by the present invention will become more fully apparent as the description that now follows is read in conjunction with the accompanying drawing.

DETAILED DESCRIPTION OF THE PREFERRED EMBODIMENTS

Figure 3:
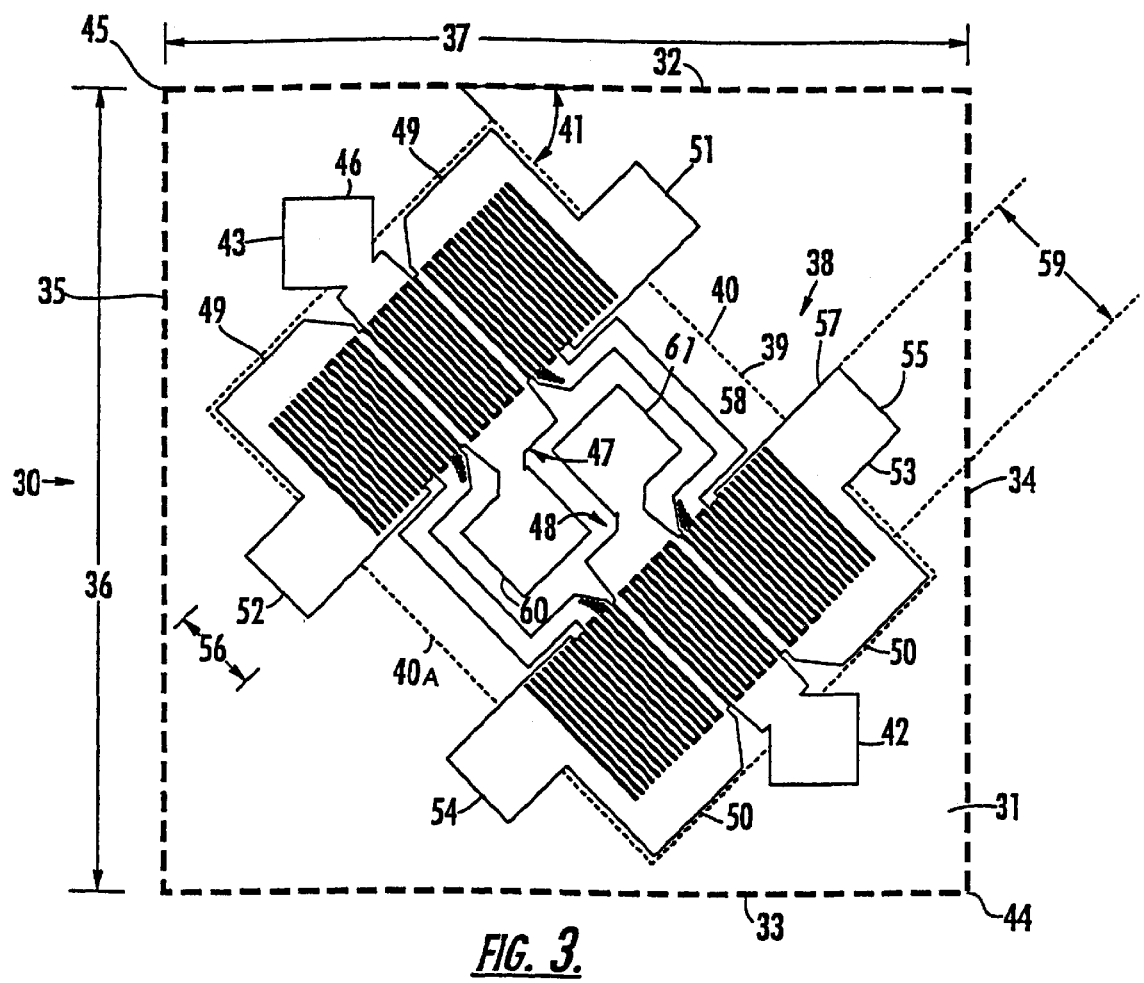
FIG. 3 illustrates a CRF layout in which the bond pads are isolated between the two tracks.
Figure 4:
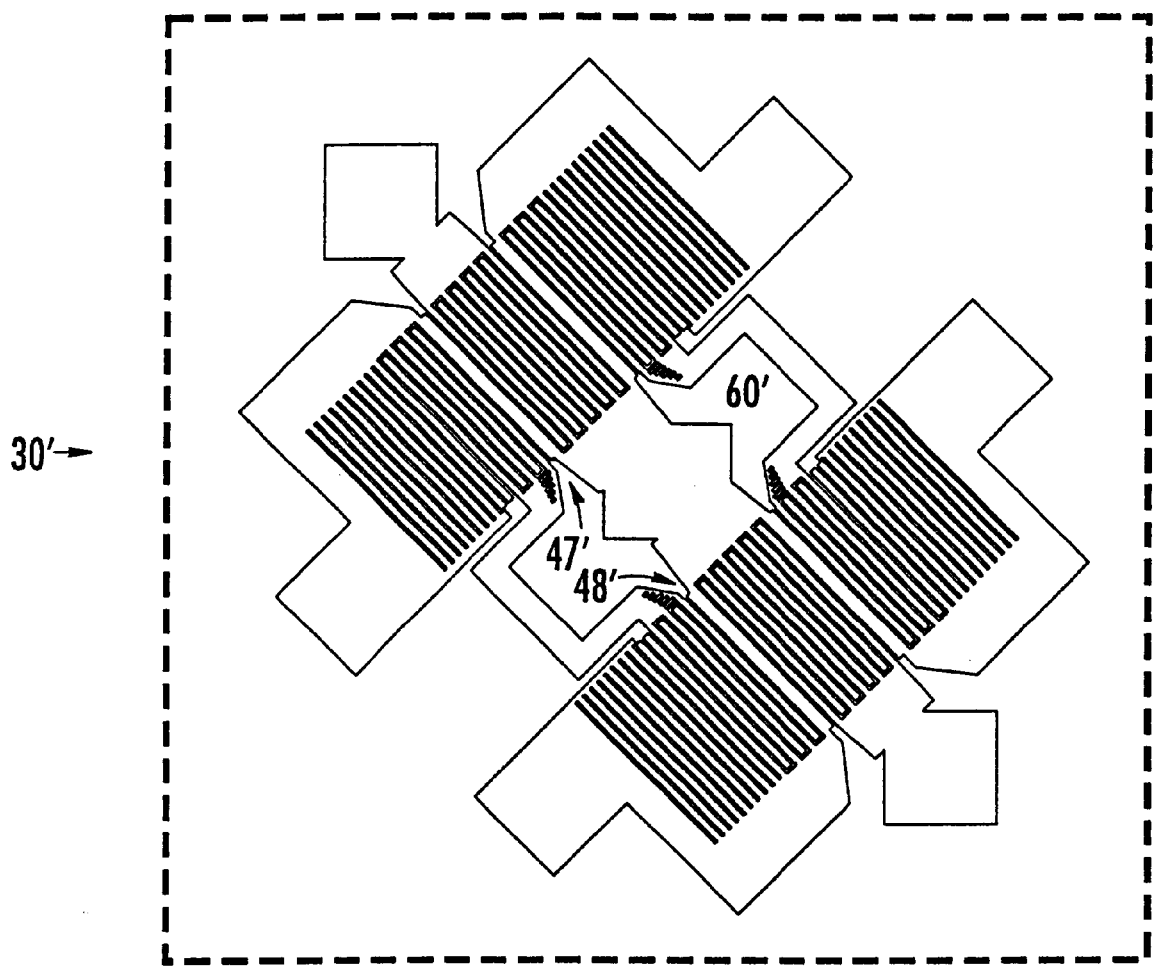
FIG. 4 illustrates another CRF layout, in which the bond pads are joined.

A description of preferred embodiments of the invention will now be presented with reference to FIGS. 3 and 4.

The current invention relates to a modified die layout for SAW CRF filters that reduces the spatial extent of the longest edge of the die through a reorientation of the electrodes and bus bars so that they are no longer parallel to the ends and sides (respectively) of the die. This reduction in the spatial extent of the longest edge of the die is achieved by rotating the die cutting lines relative to the electrode and grating patterns.

A first embodiment of a surface-acoustic-wave device 30 comprises a generally rectangular, most preferably approximately square die 31, which comprises a piezoelectric material. The base 31 has a top end 32, a bottom end 33 opposed to the top end 32, a first side 34, and a second side 35 opposed to the first side 34. The base 31 further has a width 36 along the sides 34, 35 and a length 37 along the ends 32, 33.

Positioned atop the die 31 is a surface-acoustic-wave electrode pattern 38. The electrode pattern 38 has a generally rectangular footprint 39, and the footprint has a top edge 40 that is positioned at an acute, nonzero angle 41 to the die's top end 32. In a most preferred embodiment the angle 41 comprises approximately 45 degrees.

The device 30 further comprises a pair of generally rectangular, most preferably approximately square, electrode pads 42, 43, both in electrical contact with the electrode pattern 38. A first pad 42 is positioned adjacent a first corner 44 formed by the bottom end 33 and the first side 34 of the die 31, and the second pad 43 is adjacent a second corner 45 formed by the top end 32 and the second side 35 of the die 31. Preferably a top edge 46 of each pad 42, 43 is generally parallel the die's top end 32.

The electrode pattern 38 comprises a pair of central transducers 47, 48, one transducer positioned adjacent and in electrical contact with one electrode pad 47/43 and 48/42.

Returning to FIG. 3, the electrode pattern 38 further comprises two pairs of grating arrays 49, 50, one pair positioned adjacent and generally parallel with a one of the central transducers 47, 48, generally aligned along their sides with the transducers 47, 48. In addition are provided four generally rectangular bond pads 51–54, one bond pad in electrical contact with each grating array 49, 50. Preferably each bond pad 51–54 has a top edge 55 generally parallel to the footprint's top edge 40. In an exemplary embodiment the bond pads 51–54 comprise square elements, each having an inner edge 57 that is generally collinear with an inner edge 58 of the grating array 49, 50 to which that bond pad is in electrical contact and a length 56 less than a length 59 of the grating array 49, 50.

In the arrangement shown, two top bond pads 51,53 project away from the electrode pattern's top edge 40 and the two bottom bond pads 52,54 project away from the electrode pattern's bottom edge 40A. Since the length 56 of each bond pad 51–54 is less than the length 59 of the grating array 49,50, the real estate required by these bond pads 51–54 is toward an empty corner of the die 31. This arrangement thereby decreases the required length 37 of the device 30.

Figure 2:
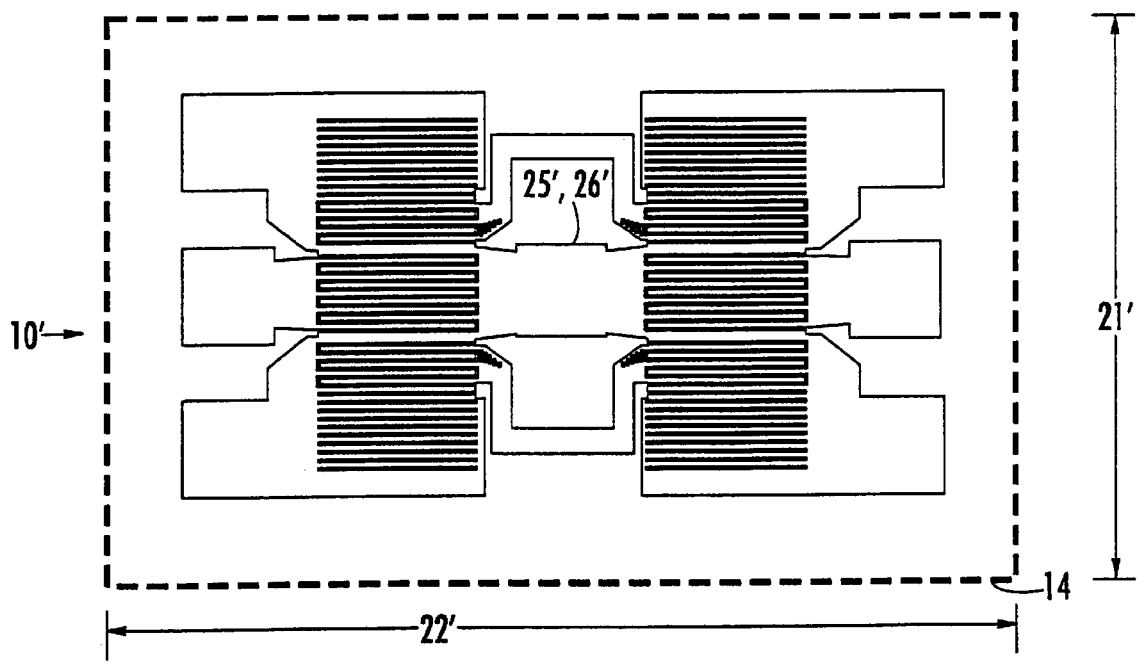
FIG. 2 (prior art) illustrates another CRF layout wherein the bond pads are joined.

A pair of generally centrally located distinct central bond pads 60, 61 are isolated electrically from each other, and each central bond pad 60, 61 is in electrical contact with a one of the central transducers 47, 48. In an alternate embodiment 30' illustrated in FIG. 4, analogous to the prior art embodiment of FIG. 2, a unitary central bond pad 60' is in contact with both of the central transducers 47', 48'.

It is clear that, for a square die 30, 30' of side 35, 37 equal to L, the diagonal of the square is the longest dimension, with a length of $L(2^{1/2})$ an increase of 41% in length over the length of one side. The current invention orients the die such that the longest device dimension (the distance between the outer edges of the two central transducers' isolated bond pads) is placed along the longest die dimension-the diagonal. Because the electrode patterns are of fixed (nonzero) width, when they are oriented at 45° to the ends of the die, a roughly triangular region is left at each corner of the die. These corners can be effectively used for bus-bar connections and bond pads.

An additional benefit of this reorientation is the fact that the bond pads can be set back fairly far from the die edges without having to increase the die size to accomplish this positioning. Once the size of the die has been set-by creating a square die large enough to contain the longest device dimension-there is automatically a substantial amount of die area available for additional bond pad placement without getting too close to the die edges. This is particularly useful for devices that are to be implemented using flip-chip technology, as the bond pads are set far enough back from the edge of the die to avoid being broken out when the die are singulated.

Figure 1:
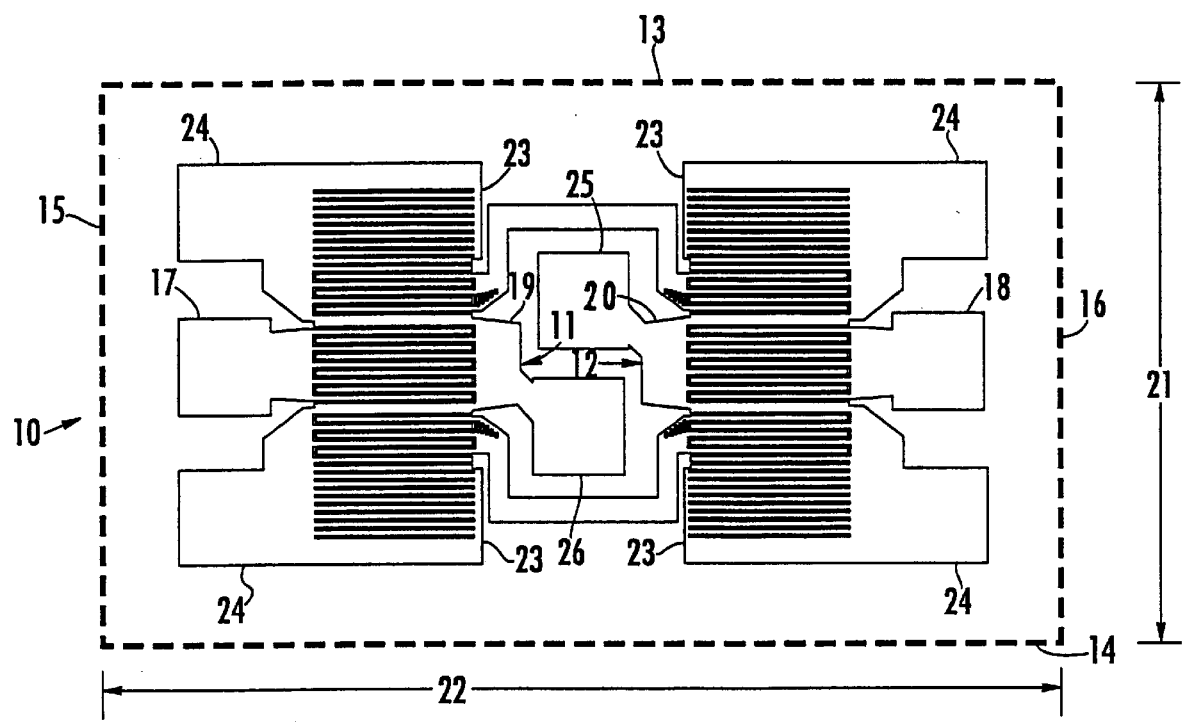
FIG. 1 (prior art) illustrates a typical coupled resonator filter layout with isolated central transducers.

The drawings herein presented are generally shown to scale, and it is clear that the current invention allows the spatial extent of the longest die edge to be reduced from (in these examples) approximately 42 mils (as in FIG. 1) to approximately 34 mils (as in FIG. 4). This reduction of almost 20% relative to standard die layout techniques is substantial enough allows the device to be assembled in a smaller package, resulting in reduced manufacturing costs and a smaller, more desirable device. The absolute clearances and setbacks required are specific to a given manufacturing process. As manufacturing processes evolve, the requirements for such setbacks tend to get smaller. Clearly the present invention would be applicable and provide significant advantage, even with an advanced manufacturing technique that would require much smaller tolerances and clearances than shown in FIGS. 1–4.

In the foregoing description, certain terms have been used for brevity, clarity, and understanding, but no unnecessary limitations are to be implied therefrom beyond the requirements of the prior art, because such words are used for description purposes herein and are intended to be broadly construed. Moreover, the embodiments of the apparatus illustrated and described herein are by way of example, and the scope of the invention is not limited to the exact details of construction.

Having now described the invention, the construction, the operation and use of preferred embodiment thereof, and the advantageous new and useful results obtained thereby, the new and useful constructions, and reasonable mechanical equivalents thereof obvious to those skilled in the art, are set forth in the appended claims.

What is claimed is:

1. A surface-acoustic-wave device comprising:
   a generally square die comprising a piezoelectric material;
   a surface-acoustic-wave electrode pattern positioned atop the die, the pattern having a generally rectangular footprint, the footprint having a top edge positioned at an acute, nonzero angle to a top end of the die; and
   a pair of generally rectangular electrode pads, both in electrical contact with the electrode pattern, a first pad adjacent a first corner formed by a bottom end and a first side of the die, a second pad adjacent a second corner formed by the top end and a second side of the die opposed to the first side.

2. The die recited in claim 1, wherein the electrode pads comprise generally square pads.

3. A method of laying out a surface-acoustic-wave die comprising the steps of:

positioning a surface-acoustic-wave electrode pattern atop a generally rectangular die comprising a piezoelectric material, the pattern having a generally rectangular footprint, the footprint having a top edge positioned at an acute, nonzero angle to a top end of the die, wherein the electrode pattern comprises a pair of central transducers, one transducer positioned adjacent and in electrical contact with one electrode pad and a unitary bond pad in contact with both of the central transducers; and positioning a pair of generally rectangular electrode pads atop the die, both electrode pads in electrical contact with the electrode pattern, a first pad adjacent a first corner formed by a bottom end and a first side of the die, a second pad adjacent a second corner formed by the top end and a second side of the die opposed to the first side.

4. A surface-acoustic-wave device comprising:
   a generally rectangular die comprising a piezoelectric material;
   a surface-acoustic-wave electrode pattern positioned atop the die, the pattern having a generally rectangular footprint, the footprint having a top edge positioned at an acute, nonzero angle to a top end of the die; and
   a pair of generally rectangular electrode pads, both in electrical contact with the electrode pattern, a first pad adjacent a first corner formed by a bottom end and a first side of the die, a second pad adjacent a second corner formed by the top end and a second side of the die opposed to the first side, wherein a top edge of each pad is generally parallel the die top end.

5. A surface-acoustic-wave device comprising:
   a generally rectangular die comprising a piezoelectric material;
   a surface-acoustic-wave electrode pattern positioned atop the die, the pattern having a generally rectangular footprint, the footprint having a top edge positioned at an angle of approximately 45 degrees to a top end of the die; and
   a pair of generally rectangular electrode pads, both in electrical contact with the electrode pattern, a first pad adjacent a first corner formed by a bottom end and a first side of the die, a second pad adjacent a second corner formed by the top end and a second side of the die opposed to the first side.

6. A surface-acoustic-wave device comprising:
   a generally rectangular die comprising a piezoelectric material; a surface-acoustic-wave electrode pattern positioned atop the die, the pattern having a generally rectangular footprint, the footprint having a top edge positioned at an acute, nonzero angle to a top end of the die, wherein the electrode pattern comprises a pair of central transducers, one transducer positioned adjacent and in electrical contact with one electrode pad, and a pair of generally centrally located distinct central bond pads isolated electrically from each other; and
   a pair of generally rectangular electrode pads, both in electrical contact with the electrode pattern, a first pad adjacent a first corner formed by a bottom end and a first side of the die, a second pad adjacent a second corner formed by the top end and a second side of the die opposed to the first side.

7. The die recited in claim 6, wherein the electrode pattern further comprises two pairs of grating arrays, one pair positioned adjacent and generally parallel with a one of the central transducers.

8. A surface-acoustic-wave device comprising:
  a generally rectangular die comprising a piezoelectric material;
  a surface-acoustic-wave electrode pattern positioned atop the die, the pattern having a generally rectangular footprint, the footprint having a top edge positioned at an acute, nonzero angle to a top end of the die, wherein the electrode pattern comprises a pair of central transducers, one transducer positioned adjacent and in electrical contact with one electrode pad, and a unitary central bond pad in electrical contact with both of the central transducers; and
  a pair of generally rectangular electrode pads, both in electrical contact with the electrode pattern, a first pad adjacent a first corner formed by a bottom end and a first side of the die, a second pad adjacent a second corner formed by the top end and a second side of the die opposed to the first side.

9. A surface-acoustic-wave device comprising:
  a generally rectangular die comprising a piezoelectric material;
  a surface-acoustic-wave electrode pattern positioned atop the die, the pattern having a generally rectangular footprint, the footprint having a top edge positioned at an acute, nonzero angle to a top end of the die, wherein the electrode pattern comprises a pair of transducer/grating arrays having a pair of central transducers, one transducer positioned adjacent and in electrical contact with one electrode pad, two pairs of grating arrays, one grating array adjacent and above and one grating array adjacent and below each transducer, each transducer/grating array having substantially parallel inner edges, and further having four bond pads, one bond pad in electrical contact with each grating array; and
  a pair of generally rectangular electrode pads, both in electrical contact with the electrode pattern, a first pad adjacent a first corner formed by a bottom end and a first side of the die, a second pad adjacent a second corner formed by the top end and a second side of the die opposed to the first side.

10. The device recited in claim 9, wherein each bond pad is generally rectangular, top bond pads projecting away from the electrode pattern top edge and bottom bond pads projecting away from the electrode pattern bottom edge.

11. The device recited in claim 10, wherein an inner edge of each bond pad is substantially collinear with an inner edge of a grating array.

12. A method of laying out a surface-acoustic-wave die comprising the steps of:
  positioning a surface-acoustic-wave electrode pattern atop a generally square die comprising a piezoelectric material, the pattern having a generally rectangular footprint, the footprint having a top edge positioned at an acute, nonzero angle to a top end of the die; and
  positioning a pair of generally rectangular electrode pads atop the die, both electrode pads in electrical contact with the electrode pattern, a first pad adjacent a first corner formed by a bottom end and a first side of the die, a second pad adjacent a second corner formed by the top end and a second side of the die opposed to the first side.

13. The method recited in claim 12, wherein the electrode pads comprise generally square pads.

14. A method of laying out a surface-acoustic-wave die comprising the steps of:
  positioning a surface-acoustic-wave electrode pattern atop a generally rectangular die comprising a piezoelectric material, the pattern having a generally rectangular footprint, the footprint having a top edge positioned at an acute, nonzero angle to a top end of the die, wherein the electrode pattern comprises a pair of central transducers, one transducer positioned adjacent and in electrical contact with one electrode pad, and a pair of generally centrally located distinct bond pads isolated electrically from each other, each bond pad in contact with a one of the central transducers; and
  positioning a pair of generally rectangular electrode pads atop the die, both electrode pads in electrical contact with the electrode pattern, a first pad adjacent a first corner formed by a bottom end and a first side of the die, a second pad adjacent a second corner formed by the top end and a second side of the die opposed to the first side.

15. A method of laying out a surface-acoustic-wave die comprising the steps of:
  positioning a surface-acoustic-wave electrode pattern atop a generally rectangular die comprising a piezoelectric material, the pattern having a generally rectangular footprint, the footprint having a top edge positioned at an acute, nonzero angle to a top end of the die; and
  positioning a pair of generally rectangular electrode pads atop the die, both electrode pads in electrical contact with the electrode pattern, a first pad adjacent a first corner formed by a bottom end and a first side of the die, a second pad adjacent a second corner formed by the top end and a second side of the die opposed to the first side, wherein a top edge of each pad is generally parallel the die top end.

16. A method of laying out a surface-acoustic-wave die comprising the steps of:
  positioning a surface-acoustic-wave electrode pattern atop a generally rectangular die comprising a piezoelectric material, the pattern having a generally rectangular footprint, the footprint having a top edge positioned at an angle of approximately 45 degrees to a top end of the die; and
  positioning a pair of generally rectangular electrode pads atop the die, both electrode pads in electrical contact with the electrode pattern, a first pad adjacent a first corner formed by a bottom end and a first side of the die, a second pad adjacent a second corner formed by the top end and a second side of the die opposed to the first side.

* * * * *